(12) United States Patent
Sankman et al.

(10) Patent No.: US 10,535,595 B2
(45) Date of Patent: Jan. 14, 2020

(54) CONDUCTIVE BASE EMBEDDED INTERCONNECT

(71) Applicant: Intel Corporation, Santa Clara, CA (US)

(72) Inventors: Robert L. Sankman, Phoenix, AZ (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,402

(22) PCT Filed: Dec. 26, 2015

(86) PCT No.: PCT/US2015/000398
§ 371 (c)(1),
(2) Date: May 15, 2018

(87) PCT Pub. No.: WO2017/111840
PCT Pub. Date: Jun. 29, 2017

(65) Prior Publication Data
US 2018/0301405 A1 Oct. 18, 2018

(51) Int. Cl.
*H01L 23/48* (2006.01)
*H01L 23/52* (2006.01)
*H01L 23/498* (2006.01)
*H01L 25/065* (2006.01)
(Continued)

(52) U.S. Cl.
CPC .... *H01L 23/49827* (2013.01); *H01L 23/5383* (2013.01); *H01L 23/5385* (2013.01); *H01L 24/19* (2013.01); *H01L 24/20* (2013.01); *H01L 25/0655* (2013.01); *H01L 2224/73267* (2013.01)

(58) Field of Classification Search
CPC ..... H01L 25/0657; H01L 24/32; H01L 24/48; H01L 24/97; H01L 23/49827; H01L 23/3114; H01L 23/5389; H01L 24/29; H01L 2224/0508; H01L 24/45; H01L 23/147; H01L 24/20; H01L 23/49833; H01L 23/5226; H01L 23/5384;
(Continued)

(56) References Cited

U.S. PATENT DOCUMENTS

| 8,802,454 B1 | 8/2014 | Rahman et al. |
| 2012/0104578 A1 | 5/2012 | Hu et al. |
| 2013/0154109 A1 | 6/2013 | Venkatraman et al. |

(Continued)

OTHER PUBLICATIONS

International Preliminary Report on Patentablity for International Patent Application No. PCT/US2015/000398, dated Jul. 5, 2018, 12 pages.

(Continued)

*Primary Examiner* — Theresa T Doan
(74) *Attorney, Agent, or Firm* — Schwabe, Williamson & Wyatt P.C.

(57) ABSTRACT

Embodiments are generally directed to a conductive base embedded interconnect. An embodiment of an apparatus includes a substrate; an embedded interconnect layer in a first side of the substrate, the embedded interconnect layer including a plurality of contacts; and one or more conductive paths through the substrate, the one or more conductive paths being connected with the embedded interconnect layers.

17 Claims, 10 Drawing Sheets

(51) Int. Cl.
*H01L 23/538* (2006.01)
*H01L 23/00* (2006.01)

(58) Field of Classification Search
CPC . H01L 2224/02331; H01L 2224/73267; H01L 2924/18162; H01L 24/80; H01L 25/043
USPC ........................................................ 257/737
See application file for complete search history.

(56) References Cited

U.S. PATENT DOCUMENTS

2013/0214423 A1* 8/2013 Sadaka ................. H01L 21/486
257/774
2014/0042643 A1 2/2014 Yu et al.

OTHER PUBLICATIONS

International Search Report and Written Opinion for International Patent Application No. PCT/US2015/000398 dated Sep. 26, 2016, 15 pgs.

* cited by examiner

SILICON WAFER
310

SILICON WAFER
310

SILICON WAFER
310

CONDUCTIVE BASE EMBEDDED INTERCONNECT

CROSS-REFERENCE TO RELATED APPLICATION

This patent application is a U.S. National Phase Application under 35 U.S.C. § 371 of International Application No. PCT/US2015/000398, filed Dec. 26, 2015, entitled "CONDUCTIVE BASE EMBEDDED INTERCONNECT," which designates the United States of America, the entire disclosure of which is hereby incorporated by reference in its entirety and for all purposes.

TECHNICAL FIELD

Embodiments described herein generally relate to the field of electronic devices and, more particularly, to a conductive base embedded interconnect.

BACKGROUND

In the fabrication of electronic devices, the interfaces of devices with other devices become more complex as the device structure increases. One structure that is utilized to provide an in-package high density interconnect of chips is the Embedded Multi-Die Interconnect Bridge (EMIB) of Intel Corporation.

However, the use of such an embedded interconnect can be enhanced by providing power through the bridge via vertical connections. For example, a current interconnect bridge structure has horizontal wires supplying power to contact bumps, such as to provide power to a die that is above the bridge. The interconnect bridge structure does not include a vertical conduction path, and power to the bump contacts above the bridge is supplied laterally from outside the bridge. A vertical current path for power delivery offers an enhanced solution with a lower resistance and inductance than the lateral paths.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to conductive base embedded interconnect.

For the purposes of this description:

"Through silicon via" or "TSV" refers to a vertical (perpendicular to a surface) electrical connection (or via) that passes through a silicon wafer or die.

"Substrate" or "wafer" refers to a slice of a substance, including a slice of semiconductor material, such as silicon, used in electronics for the fabrication of integrated circuits and in photovoltaics for conventional, wafer-based solar cells.

"Embedded interconnects" means interconnects that are embedded within a substrate. Embedded interconnects include, but is not limited to, the Embedded Multi-Die Interconnect Bridge of Intel Corporation. An Embedded Multi-Die Interconnect Bridge is generally referred to as an EMIB or interconnect bridge herein In some embodiments, an apparatus, system, or method includes a conductive base embedded interconnect. In some embodiments, an embedded interconnect, including but not limited to an EMIB, includes one or more conductive paths from below the embedded interconnect to a surface contact for the embedded interconnection. In some embodiments, a conductive path provides power via a conductive base that is formed below the embedded interconnect.

An EMIB provides a high density interconnect within a package for connection of chips, wherein EMIB includes a fine network of metal and dielectric layers, the layers being embedded below a surface of a substrate, with bump contacts above the metal and dielectric layers. However, certain of the bumps require a connection with a power supply.

However, a current EMIB solution lacks a vertical conduction path that originates from the organic substrate layers directly below the Interconnect Bridge, and then through the Interconnect Bridge to its top surface. To provide a connection to a power supply, power to the bumps above the interconnect bridge are supplied laterally from outside the bridge. This structure creates relatively long paths for power, with supply noise due to the inductance and resistance of these paths.

In some embodiments, a conduction base embedded interconnect bridge provides a conductive path from the organic substrate wires to the interconnect bridge and ultimately to the topside contacts. In some embodiments, a conductive path includes one of:

(1) A conductive path for the bridge including multiple through silicon vias (TSVs) and an electrical connection between the plurality of TSVs utilizing a conductive film, wherein the conductive film may include an anisotropic (directional dependent) conductive adhesive film. The connection utilizing the TSVs and conductive film provides a multiple independent current paths to the interconnect bridge.

(2) A conductive path for the bridge utilizing a conductive substrate, wherein the conductive path is connected via ohmic contacts and a conductive adhesive film. The connection utilizing the conductive substrate provides a single conductive path to the interconnect bridge.

The conductive paths for the bridge apply known technologies for chip packaging, which such technologies are applied to create a conductive path for an EMIB. In some embodiments, such technologies may be tailored for application in a conductive interconnect bridge by adjusting CTE (Coefficient of Thermal Expansion), Tg (Glass Transition Temperature relating to temperature at which material transitions between liquid and glassy state), and other key material properties. In some embodiments, material of a conductive substrate includes material with a CTE that is in or near the range of the CTE of silicon (CTE ~3 ppm/° C.) (parts per million per degree Celsius) and an organic substrate (CTE ~15 ppm/° C.). Materials may include, but are not limited to, copper (CTE ~3 ppm/° C.), stainless steel (CTE ~10 to 17 ppm/° C.), nickel (CTE ~13 ppm/° C.), or other various metal alloys. However, embodiments are not limited to particular conductive substrate materials.

An ohmic contact is a non-rectifying junction, and herein refers to the ohmic contact of a metal to a semiconductor material. Ohmic contacts are also well understood in fields including semiconductor packaging.

In some embodiments, a conductive adhesive includes conductive particles (such as particles of metal) in the adhesive. In some embodiments, the conductive adhesive is anisotropic (directionally dependent), wherein pressure will cause the conductive particles in a direction of a force to make contact and create an electrical connections. However, particles in a different direction from the force will not be forced together and will not create an electrical connection. In this manner, multiple independent connections between TSVs and substrate wires may be made without inducing a short between the TSVs as the rest of the adhesive will act as an insulator.

Figure 1:
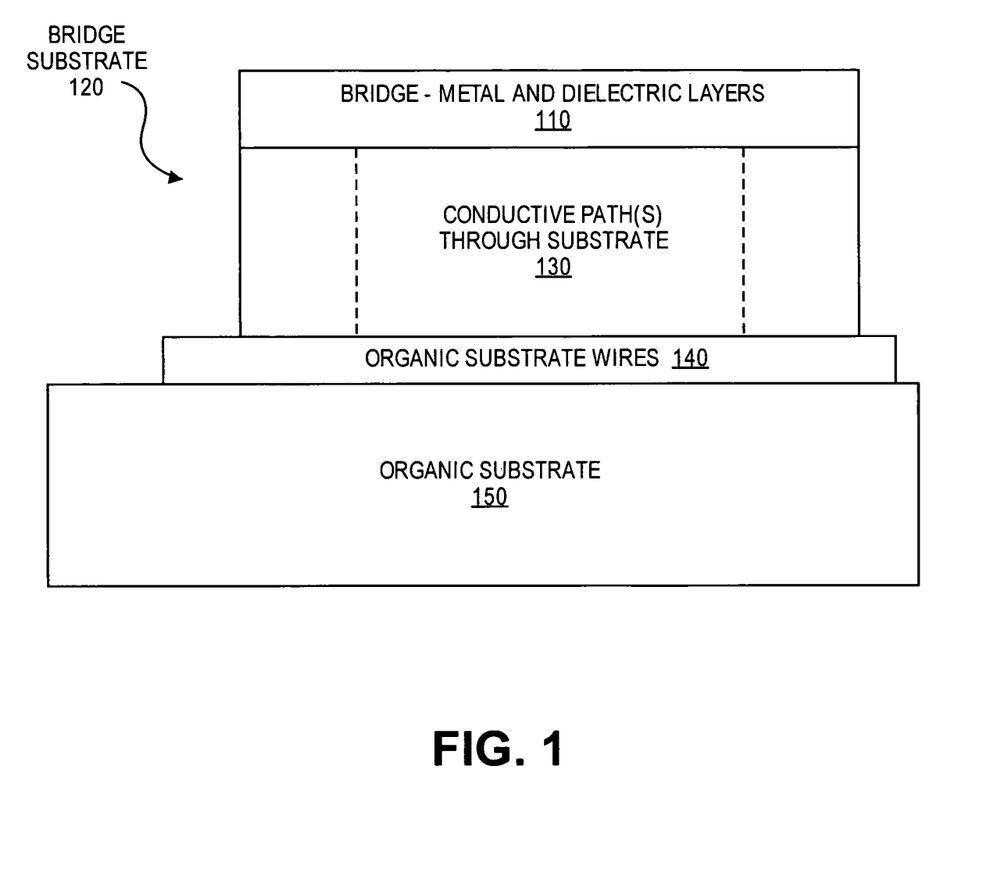
FIG. 1 is an illustration of a conductive base embedded interconnect according to an embodiment.

FIG. 1 is an illustration of a conductive base embedded interconnect according to an embodiment. FIG. 1 provides a general illustration of an embodiment, wherein more specific embodiments are illustrated in FIGS. 3A to 6.

In some embodiments, an apparatus may include an interconnect bridge structure coupled with substrate wires 140 of an organic substrate 150. In some embodiments, the bridge structure includes metal and dielectric layers embedded within a bridge substrate 120.

In some embodiments, an apparatus, system, or process provides for one or more conductive paths 130 through the bridge substrate 120. In some embodiments, the one or more conductive paths may include multiple conductive paths enabled with multiple through silicon vias, such as illustrated in FIGS. 3A to 3F. In some embodiments, the one or more conductive paths may include a single conductive path through a conductive substrate, such as illustrated in FIG. 4A to 4E.

Figure 2:
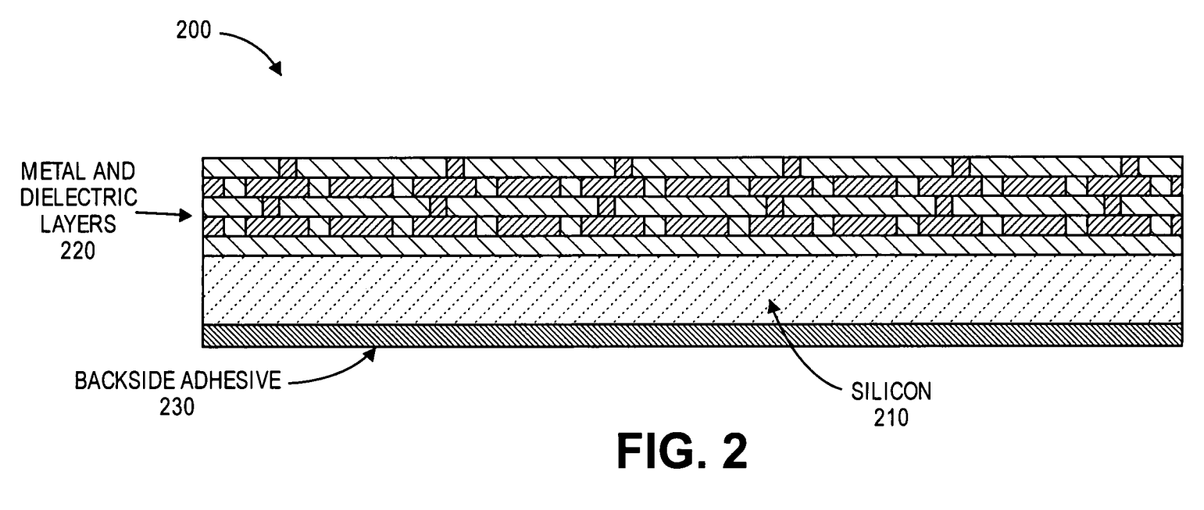
FIG. 2 is an illustration of an embedded multi-chip interconnect bridge (EMIB)

FIG. 2 is an illustration of an embedded multi-chip interconnect bridge (EMIB). In FIG. 2, a EMIB 200 includes a silicon substrate 210; metal and dielectric layers 220 embedded in the substrate 210, the metal layers including contacts on a surface of the substrate; and a backside adhesive 230 for coupling with a substrate below (which is not illustrated in FIG. 2).

However, in a conventional structure, there is no conductive path through the substrate 210 to provide a connection between the metal layers 220 and wire connections of the attached substrate below.

FIGS. 3A-3F illustrate fabrication of a conductive base interconnect bridge on a silicon substrate using through silicon via technology according to an embodiment.

Figure 3A:
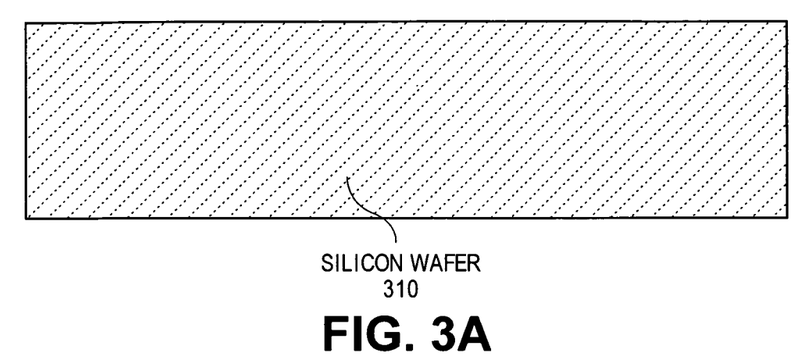
FIGS. 3A-3F illustrate fabrication of a conductive base interconnect bridge on a silicon substrate using through silicon via technology according to an embodiment.

FIG. 3A: A silicon wafer 310 is fabricated for a substrate of the interconnect bridge.

Figure 3B:
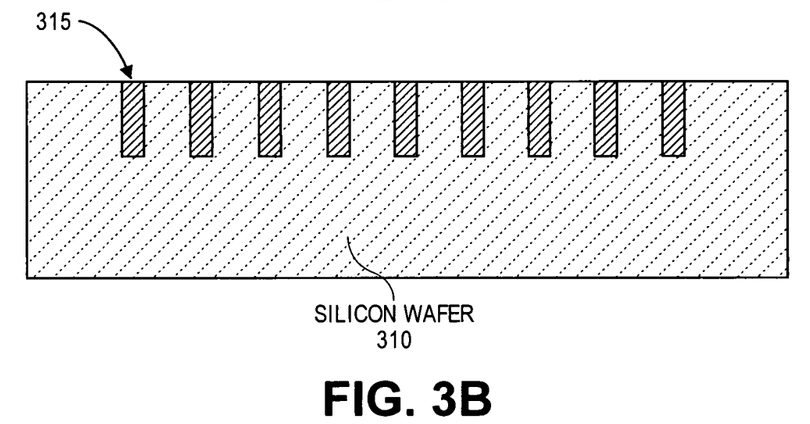

FIG. 3B: Multiple through silicon vias 315 are formed in the silicon wafer 310, where the through silicon vias 315 may be formed by a means known by those of skill in the art.

Figure 3C:
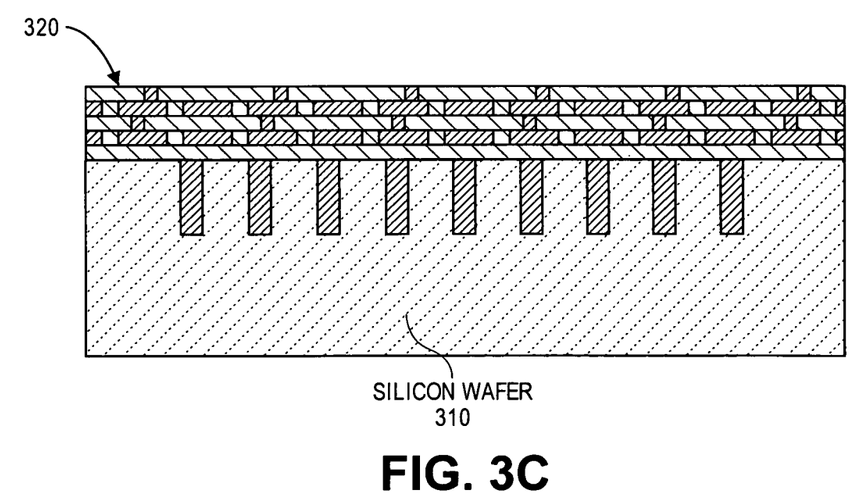

FIG. 3C: Processing of frontside layers, whereby metal and dielectric layers 320 are embedded in a top surface of the silicon wafer 310 to connect with the through silicon vias 315 and provide a conductive path to contacts on the surface of the silicon wafer 310.

Figure 3D:
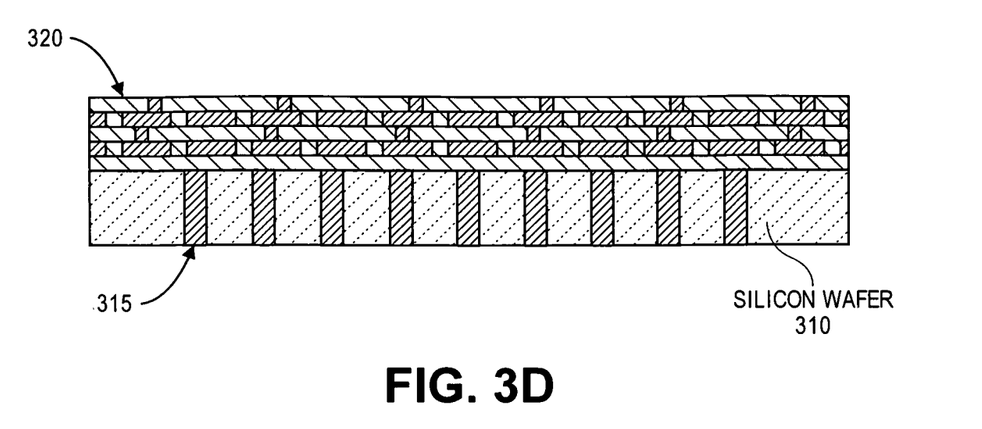

FIG. 3D: The silicon wafer 310 is processed (removing a layer of silicon) to reveal the through silicon vias 315.

Figure 3E:
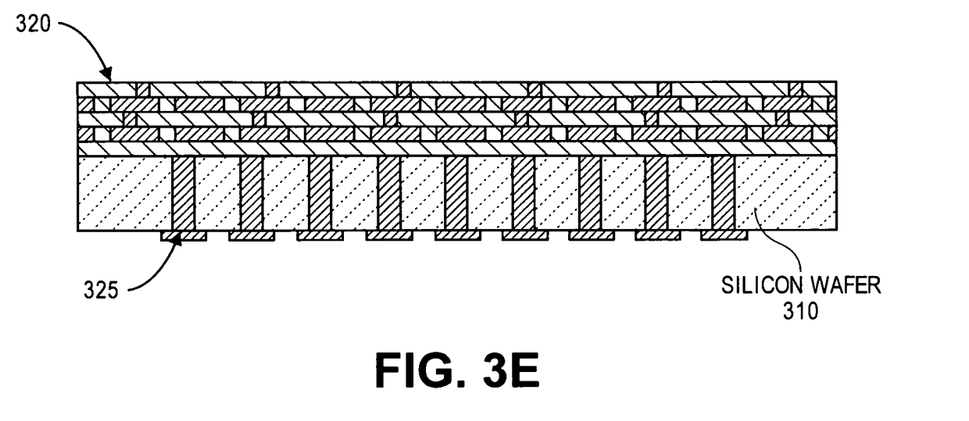

FIG. 3E: A backside RDL (redistribution layer) is attached to provide connection with the frontside layers 320 by way of the through silicon vias.

Figure 3F:
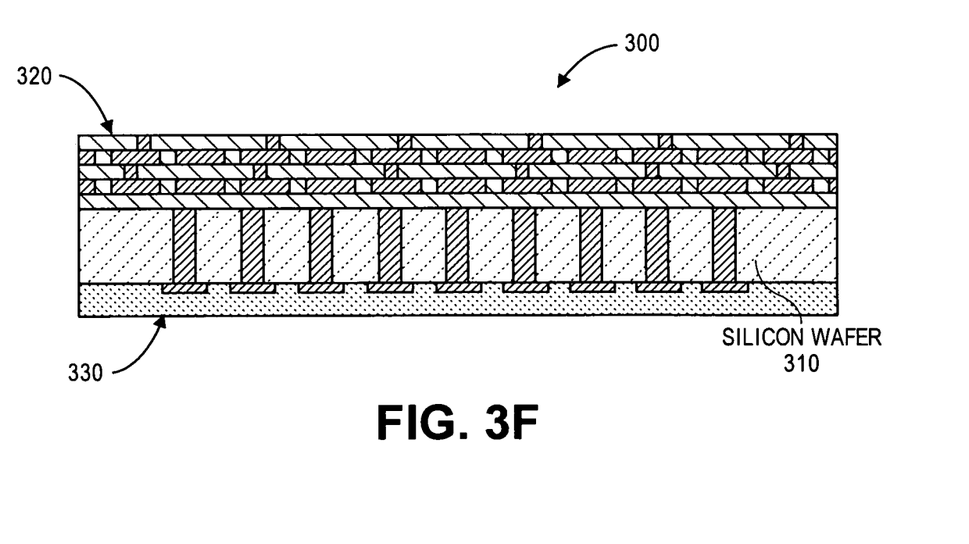

FIG. 3F: A conductive adhesive 330 is attached to the backside of the silicon substrate 310, thereby generating the conductive base embedded interconnect 300. In some embodiments, the adhesive 330 is an anisotropic conductive adhesive containing conductive particles.

FIG. 4A-4E illustrate fabrication of a conductive base interconnect bridge on a conductive substrate according to an embodiment.

Figure 4A:
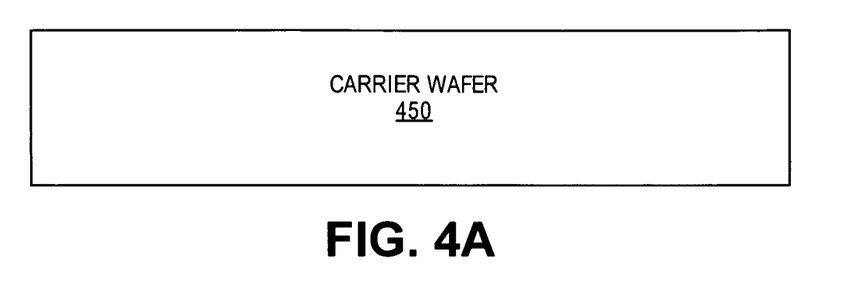
FIG. 4A-4E illustrate fabrication of a conductive base interconnect bridge on a conductive substrate according to an embodiment.

FIG. 4A: A carrier wafer 450 is provided for the fabrication of the interconnect bridge.

Figure 4B:
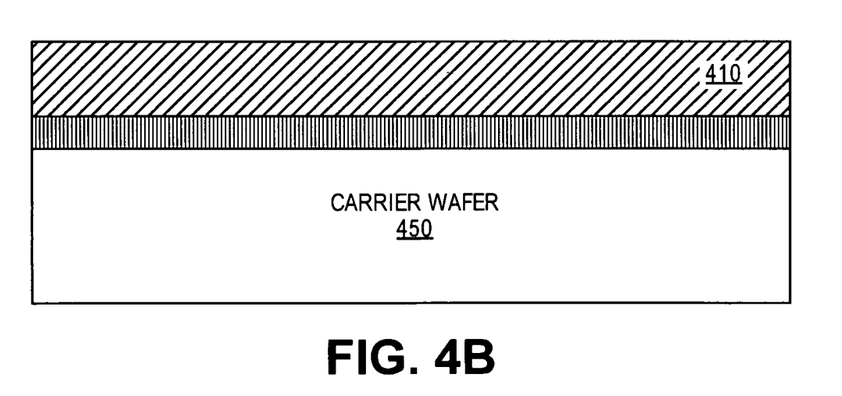

FIG. 4B: A conductive bridge substrate 410 is bonded to the carrier 450.

Figure 4C:
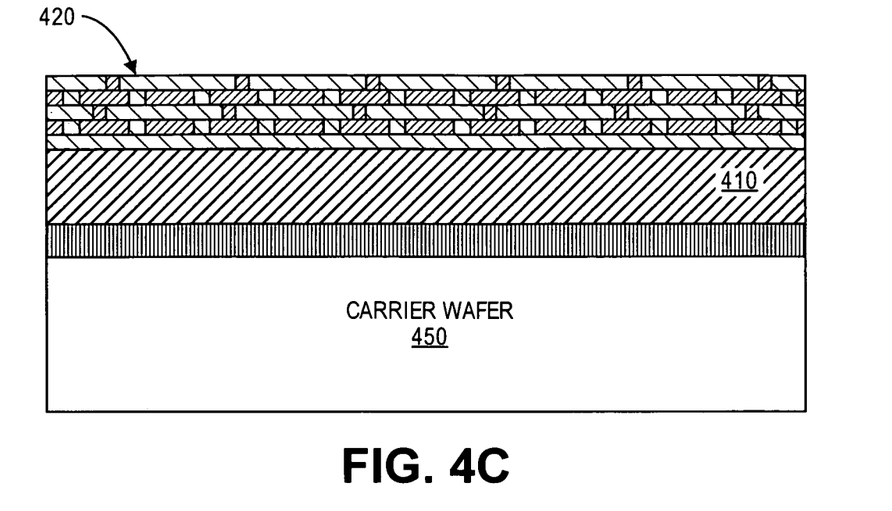

FIG. 4C: Processing of frontside layers, whereby metal and dielectric layers 420 are embedded in a top surface of the bridge substrate 410 to provide ohmic contact between the metal layers of the frontside layers 420 and the conductive base.

Figure 4D:
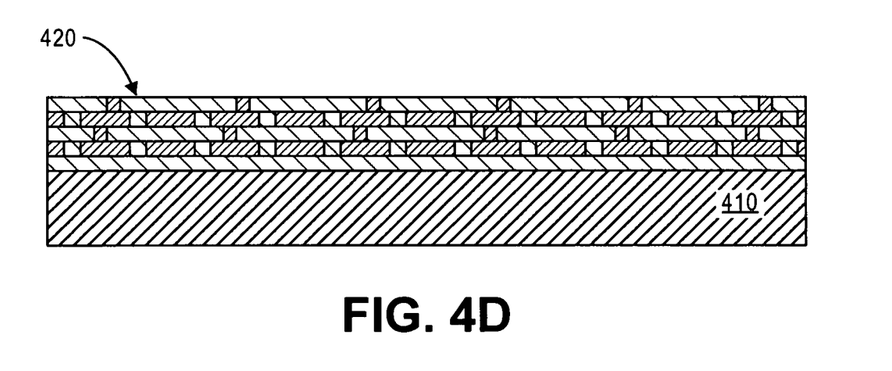

FIG. 4D: The bridge substrate 410 is de-bonded from the carrier wafer 450.

Figure 4E:
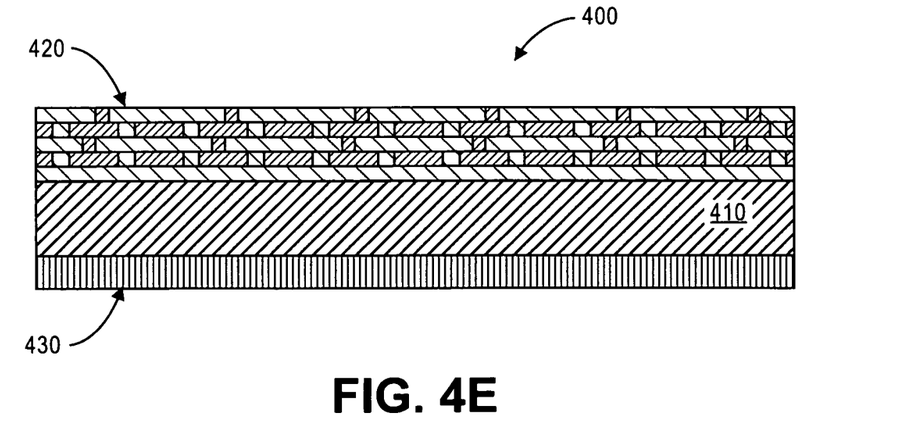

FIG. 4E: A conductive adhesive 430 is attached to the backside of the bridge substrate 410, thereby generating the conductive base embedded interconnect 410.

Figure 5:
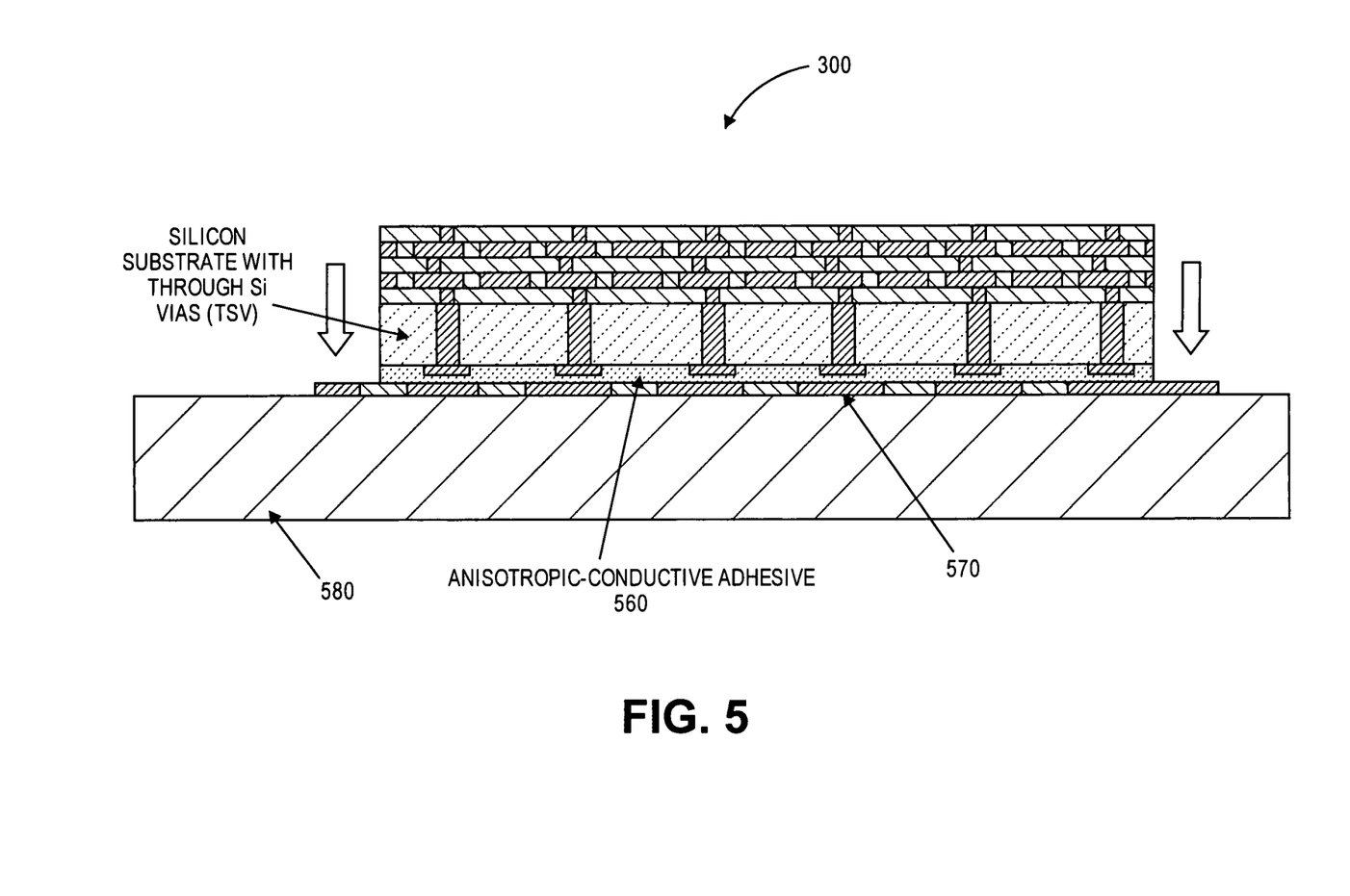
FIG. 5 illustrates coupling of a conductive base interconnect bridge on a silicon substrate using through silicon via technology with an organic substrate according to an embodiment.

FIG. 5 illustrates coupling of a conductive base interconnect bridge on a silicon substrate using through silicon via technology with an organic substrate according to an embodiment. In some embodiments, a conductive base interconnect bridge 300, such as illustrated in FIG. 3F, is attached with a metal wire layer 570 in a cavity of an organic substrate 580 utilizing an anisotropic conductive adhesive 560. In some embodiments, the pressure applied in the attachment of the interconnect bridge 300 with the organic substrate 580 generates an electrical connection between an RDL layer of the conductive base interconnect bridge 300 and the wires of the wire layer 570 while maintaining insulation between the through silicon vias.

Figure 6:
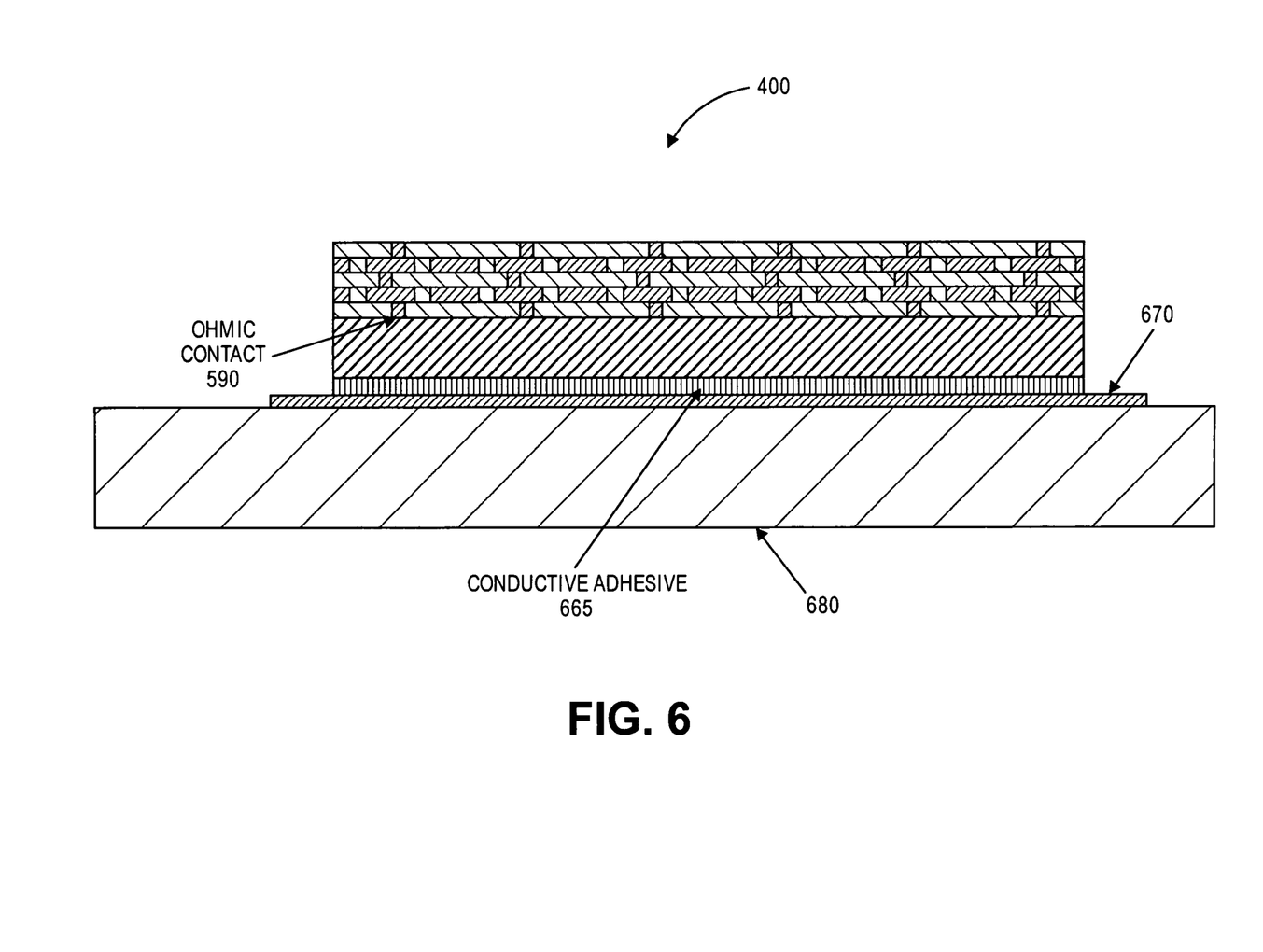
FIG. 6 illustrates coupling of a conductive base interconnect bridge on a silicon substrate using through silicon via technology with an organic substrate according to an embodiment.

FIG. 6 illustrates coupling of a conductive base interconnect bridge on a silicon substrate using through silicon via technology with an organic substrate according to an embodiment. In some embodiments, a conductive base interconnect bridge 400, such as illustrated in FIG. 4E, is attached with a metal wire layer 670 in a cavity of an organic substrate 680 utilizing a conductive adhesive 665. In some embodiments, the conductive adhesive 665 creates a conductive path from the wire layer 670 to the upper contacts of the interconnect bridge 400 utilizing the ohmic contact 590 between the frontside layer and conductive bridge substrate of the interconnect bridge 400.

Figure 7:
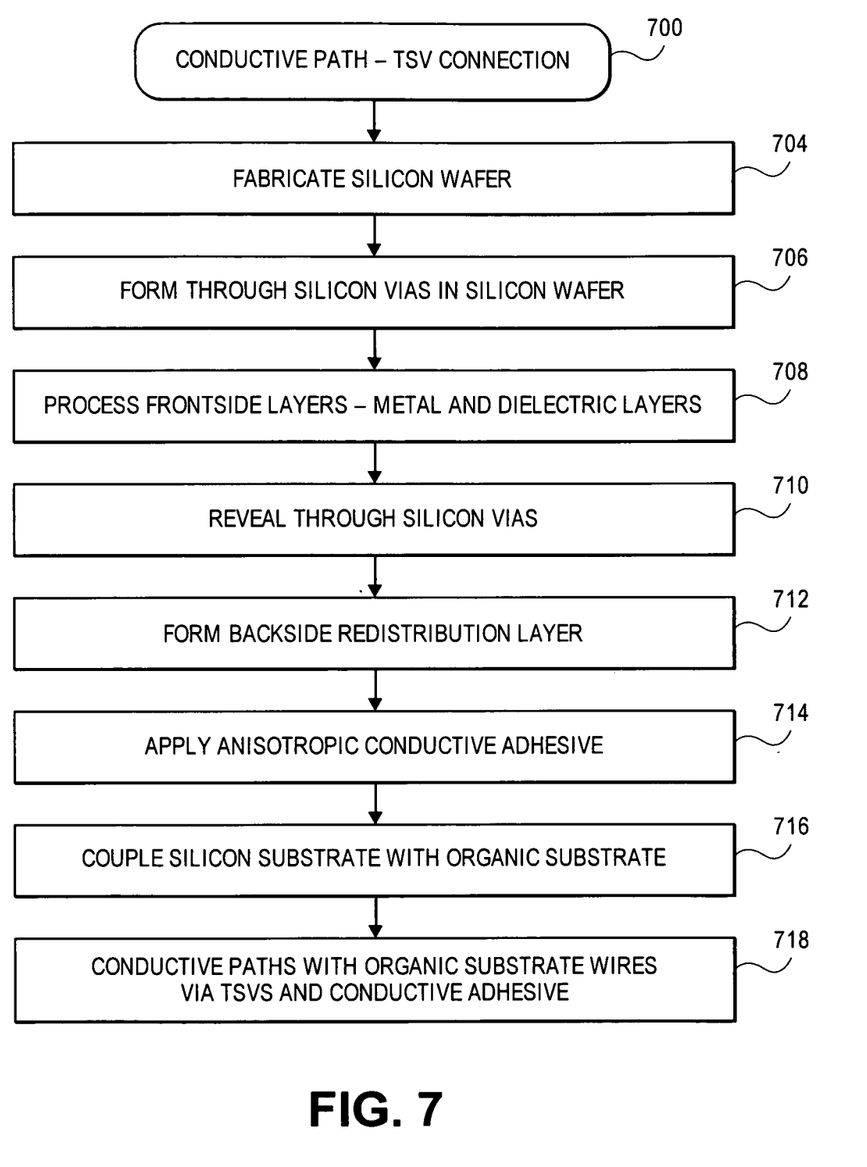
FIG. 7 is a flowchart to illustrate fabrication of a conductive path for an interconnect bridge on a silicon substrate using through silicon via technology according to an embodiment.

FIG. 7 is a flowchart to illustrate fabrication of a conductive path for an interconnect bridge on a silicon substrate using through silicon via technology according to an embodiment. In some embodiments, a fabrication process 700 may include the following:

704: Fabrication of a silicon wafer as a substrate for the interconnect bridge.

706: Formation of multiple through silicon vias in the silicon wafer.

708: Processing of frontside layers including embedding metal and dielectric layers in a top surface of the silicon wafer.

710: Revealing the through silicon vias by processing of the silicon wafer.

712: Forming a back side RDL (redistribution layer) on the silicon bridge substrate.

714: Application of anisotropic conductive adhesive to backside of silicon bridge substrate.

716: Coupling of silicon bridge substrate with organic substrate.

718: Producing multiple conductive paths between interconnect bridge and organic substrate wires via the through the silicon vias, RDL, and conductive adhesive, while maintaining insulation between the through silicon vias.

Figure 8:
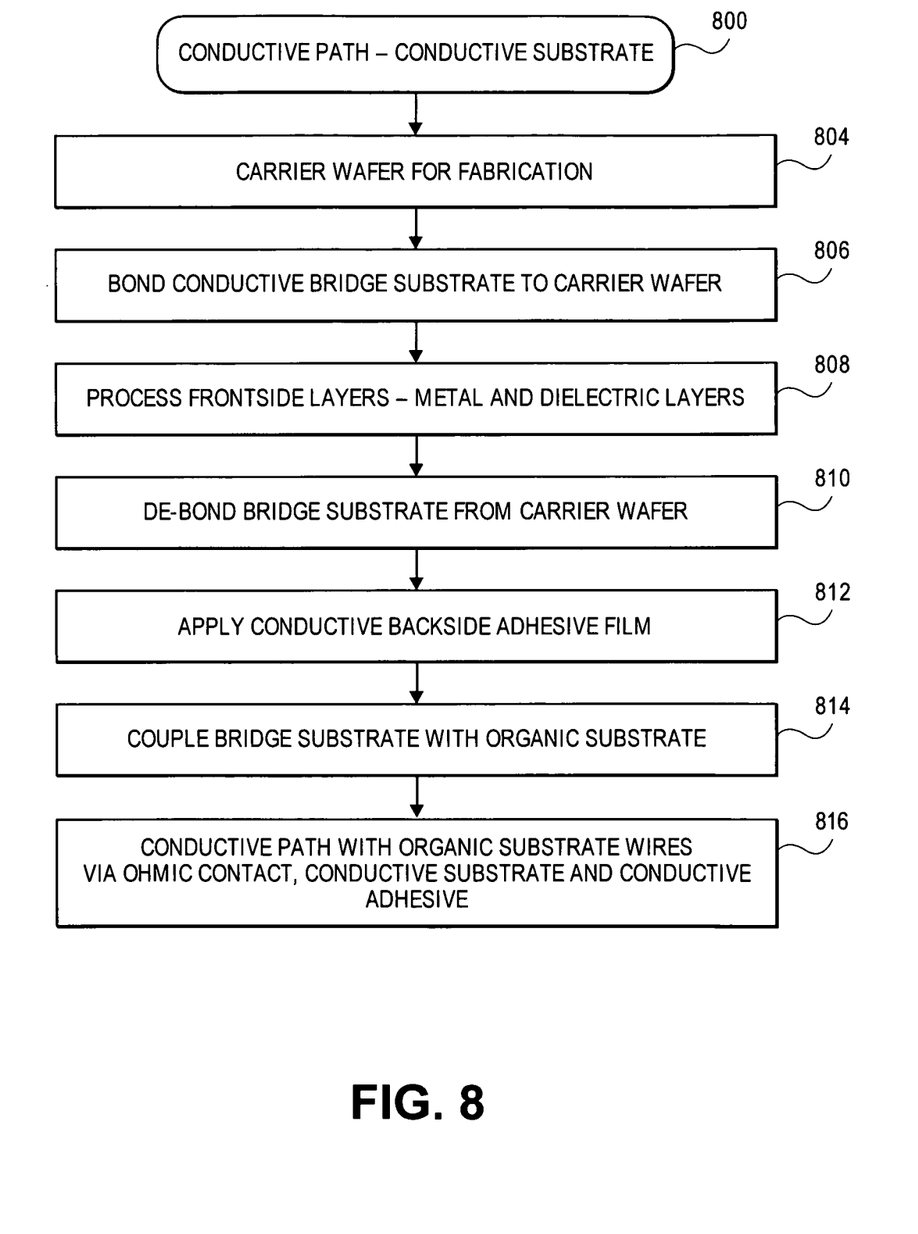
FIG. 8 is a flowchart to illustrate fabrication of a conductive path for an interconnect bridge on a conductive substrate according to an embodiment.

FIG. 8 is a flowchart to illustrate fabrication of a conductive path for an interconnect bridge on a conductive substrate according to an embodiment. In some embodiments, a fabrication process 800 may include the following:

804: Providing carrier wafer for the fabrication of an interconnect bridge.

806: Bonding conductive bridge substrate to the carrier.

808: Processing frontside layers, whereby metal and dielectric layers are embedded in a top surface of the bridge substrate.

810: De-bonding bridge substrate the carrier wafer.

812: Applying conductive adhesive to the backside of the bridge substrate.

814: Coupling bridge substrate with the organic substrate.

816: Producing conductive path with organic substrate wires via ohmic contract with frontside layer, conductive substrate, and conductive adhesive.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes a substrate; an embedded interconnect layer in a first side of the substrate, the embedded interconnect layer including a plurality of contacts; and one or more conductive paths through the substrate, the one or more conductive paths being connected with the embedded interconnect layers.

In some embodiments, the substrate is a silicon substrate including a plurality of through silicon vias, the embedded interconnect layer being coupled to a first end of the plurality of through silicon vias, and the apparatus further including a redistribution layer coupled with a second end of the plurality of through silicon vias at the second side of the silicon substrate.

In some embodiments, the apparatus is coupled with a wire layer of an organic substrate using a conductive adhesive applied to the second side of the silicon substrate. In some embodiments, the conductive adhesive is an anisotropic conductive adhesive, wherein applying pressure to the anisotropic conductive adhesive creates an electrical connection by compression of conductive particles.

In some embodiments, the one or more conductive paths include a plurality of conductive paths from the wire layer of the organic substrate to the embedded interconnect layer through the through silicon vias.

In some embodiments, the substrate is a conductive substrate, the embedded interconnect layer having an ohmic contact with the conductive substrate.

In some embodiments, the apparatus is coupled with a wire layer of an organic substrate using a conductive adhesive applied to the second side of the conductive substrate.

In some embodiments, the one of more conductive paths include a single conductive path from the wire layer of the organic substrate to the embedded interconnect layer through the conductive substrate.

In some embodiments, a method includes fabricating a substrate; embedding metal and dielectric layers in a first side of the substrate, the embedded interconnect layer including a plurality of contacts; and generating one or more conductive paths through the substrate, the one or more conductive paths being connected with the embedded interconnect layers.

In some embodiments, fabricating the substrate includes fabricating a silicon substrate, and the method further including forming a plurality of through silicon via through the silicon substrate, the embedded interconnect layer being coupled to a first end of the plurality of through silicon vias.

In some embodiments, the method further includes processing the silicon substrate to expose the through silicon vias on a second, opposite side of the silicon substrate.

In some embodiments, the method further includes forming a redistribution layer (RDL) coupled with a second end of the plurality of through silicon vias at the second side of the silicon substrate.

In some embodiments, the method further includes applying a conductive adhesive to the second side of the silicon substrate, and coupling the silicon substrate with a wire layer of an organic substrate using the conductive adhesive.

In some embodiments, the method further includes the conductive adhesive is an anisotropic conductive adhesive, further comprising applying pressure to the anisotropic conductive adhesive to create an electrical connection by compression of conductive particles.

In some embodiments, generating the one or more conductive paths includes generating a plurality of conductive paths from the wire layer of the organic substrate to the embedded interconnect layer through the through silicon vias.

In some embodiments, fabricating the substrate includes bonding a conductive bridge substrate to a carrier wafer; embedding the metal and dielectric layers in a first side of the conductive bridge substrate; and de-bonding the conductive bridge substrate from the carrier wafer.

In some embodiments, the method further includes applying a conductive adhesive to a second side of the conductive bridge substrate, and coupling the silicon substrate with a wire layer of an organic substrate using the conductive adhesive.

In some embodiments, generating the one or more conductive paths includes generating a single conductive path from the wire layer of the organic substrate to the embedded interconnect layer through the conductive bridge substrate.

In some embodiments, a package includes a plurality of chips; an organic substrate; and an interconnect bridge coupled with the organic substrate to connect one or more of the plurality of chips, the interconnect bridge including a substrate, an embedded interconnect layer in a first side of the substrate, the embedded interconnect layer including a plurality of contacts, and one or more conductive paths through the substrate to the organic substrate, the one or more conductive paths being connected with the embedded interconnect layers.

In some embodiments, the substrate is a silicon substrate including a plurality of through silicon vias, the embedded interconnect layer being coupled to a first end of the plurality of through silicon vias, the bridge interconnect further including a redistribution layer coupled with a second end of the plurality of through silicon vias at the second side of the silicon substrate.

In some embodiments, the interconnect bridge is coupled with a wire layer of the organic substrate using a conductive adhesive applied to the second side of the silicon substrate.

In some embodiments, the conductive adhesive is an anisotropic conductive adhesive, wherein applying pressure to the anisotropic conductive adhesive creates an electrical connection by compression of conductive particles.

In some embodiments, the substrate of the interconnect bridge is a conductive substrate, the embedded interconnect layer having an ohmic contact with the conductive substrate.

In some embodiments, the interconnect bridge is coupled with a wire layer of the organic substrate using a conductive adhesive applied to the second side of the conductive substrate.

What is claimed is:

1. An apparatus comprising:
   a substrate, wherein the substrate comprises a silicon substrate;
   an embedded interconnect layer in a first side of the substrate, the embedded interconnect layer including a plurality of contacts;
   one or more conductive paths through the substrate, the one or more conductive paths being connected with the embedded interconnect layer, and the one or more conductive paths including a plurality of through silicon vias, the embedded interconnect layer being coupled to a first end of the plurality of through silicon vias;
   a redistribution layer coupled with a second end of the plurality of through silicon vias at a second side of the substrate; and
   an organic substrate having a wire layer coupled to the redistribution layer using a conductive adhesive.

2. The apparatus of claim 1, wherein the conductive adhesive is an anisotropic conductive adhesive, wherein applying pressure to the anisotropic conductive adhesive creates an electrical connection by compression of conductive particles.

3. The apparatus of claim 1, wherein the one or more conductive paths include a plurality of conductive paths from the wire layer of the organic substrate to the embedded interconnect layer through the through silicon vias.

4. An apparatus comprising:
   a substrate;
   an embedded interconnect layer in a first side of the substrate, the embedded interconnect layer including a plurality of contacts; and
   one or more conductive paths through the substrate, the one or more conductive paths being connected with the embedded interconnect layers, wherein the substrate is a conductive substrate, the embedded interconnect layer having an ohmic contact with the conductive substrate, and wherein the apparatus is coupled with a wire layer of an organic substrate using a conductive adhesive applied to a second side of the conductive substrate.

5. The apparatus of claim 4, wherein the one of more conductive paths include a single conductive path from the wire layer of the organic substrate to the embedded interconnect layer through the conductive substrate.

6. A method comprising:
providing a substrate, the substrate including a silicon substrate;
embedding metal and dielectric layers in a first side of the substrate to form an embedded interconnect layer, the embedded interconnect layer including a plurality of contacts;
forming a plurality of through silicon vias through the silicon substrate, the embedded interconnect layer being coupled to a first end of the plurality of through silicon vias;
generating one or more conductive paths through the substrate, the generating the one or more conductive paths comprising processing the silicon substrate to expose the through silicon vias on a second, opposite side of the silicon substrate, the one or more conductive paths being connected with the embedded interconnect layer;
forming a redistribution layer (RDL) coupled with a second end of the plurality of through silicon vias at the second side of the silicon substrate; and
applying a conductive adhesive to the second side of the silicon substrate, and coupling the silicon substrate with a wire layer of an organic substrate using the conductive adhesive.

7. The method of claim 6, wherein the conductive adhesive is an anisotropic conductive adhesive, further comprising applying pressure to the anisotropic conductive adhesive to create an electrical connection by compression of conductive particles.

8. The method of claim 6, wherein generating the one or more conductive paths includes generating a plurality of conductive paths from the wire layer of the organic substrate to the embedded interconnect layer through the through silicon vias.

9. A method comprising:
providing a substrate;
embedding metal and dielectric layers in a first side of the substrate to form an embedded interconnect layer, the embedded interconnect layer including a plurality of contacts; and
generating one or more conductive paths through the substrate, the one or more conductive paths being connected with the embedded interconnect layers, wherein fabricating the substrate includes:
bonding a conductive bridge substrate to a carrier wafer;
embedding the metal and dielectric layers in a first side of the conductive bridge substrate; and
de-bonding the conductive bridge substrate from the carrier wafer.

10. The method of claim 9, further comprising applying a conductive adhesive to a second side of the conductive bridge substrate, and coupling the silicon substrate with a wire layer of an organic substrate using the conductive adhesive.

11. The method of claim 10, wherein generating the one or more conductive paths includes generating a single conductive path from the wire layer of the organic substrate to the embedded interconnect layer through the conductive bridge substrate.

12. A package comprising:
a plurality of chips; an organic substrate; and
an interconnect bridge coupled with the organic substrate to connect one or more of the plurality of chips, the interconnect bridge including:
a substrate, an embedded interconnect layer in a first side of the substrate, the embedded interconnect layer including a plurality of contacts, and one or more conductive paths through the substrate to the organic substrate, the one or more conductive paths being connected with the embedded interconnect layers.

13. The package of claim 12, wherein the substrate is a silicon substrate including a plurality of through silicon vias, the embedded interconnect layer being coupled to a first end of the plurality of through silicon vias, the bridge interconnect further including:
a redistribution layer coupled with a second end of the plurality of through silicon vias at the second side of the silicon substrate.

14. The package of claim 13, wherein the interconnect bridge is coupled with a wire layer of the organic substrate using a conductive adhesive applied to the second side of the silicon substrate.

15. The package of claim 14, wherein the conductive adhesive is an anisotropic conductive adhesive, wherein applying pressure to the anisotropic conductive adhesive creates an electrical connection by compression of conductive particles.

16. The package of claim 12, wherein the substrate of the interconnect bridge is a conductive substrate, the embedded interconnect layer having an ohmic contact with the conductive substrate.

17. The package of claim 16, wherein the interconnect bridge is coupled with a wire layer of the organic substrate using a conductive adhesive applied to the second side of the conductive substrate.

* * * * *